United States Patent
Kim

(10) Patent No.: US 12,288,682 B2
(45) Date of Patent: Apr. 29, 2025

(54) PROCESSING METHOD OF WAFER

(71) Applicant: DISCO CORPORATION, Tokyo (JP)

(72) Inventor: Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 382 days.

(21) Appl. No.: 17/663,066

(22) Filed: May 12, 2022

(65) Prior Publication Data

US 2022/0375742 A1   Nov. 24, 2022

(30) Foreign Application Priority Data

May 21, 2021 (JP) .................................. 2021-086011

(51) Int. Cl.
*H01L 21/02* (2006.01)
*B23K 26/38* (2014.01)
*B23K 103/00* (2006.01)

(52) U.S. Cl.
CPC .......... *H01L 21/0201* (2013.01); *B23K 26/38* (2013.01); *B23K 2103/56* (2018.08)

(58) Field of Classification Search
CPC ........... H01L 21/0201; H01L 21/67092; H01L 21/68742; H01L 21/68764; H01L 21/304; H01L 21/02021; H01L 21/02035; H01L 21/268; B23K 26/38; B23K 2103/56; B23K 26/0823; B23K 26/083; B23K 2101/40; B23K 26/361
See application file for complete search history.

(56) References Cited

U.S. PATENT DOCUMENTS

| | | | | |
|---|---|---|---|---|
| 2006/0079155 A1* | 4/2006 | Nakamura | ............ | H01L 21/302 451/41 |
| 2008/0044984 A1* | 2/2008 | Hsieh | ................ | H01L 27/14618 438/459 |
| 2011/0139757 A1* | 6/2011 | Millman, Jr. | ........ | B23K 26/142 219/121.68 |
| 2021/0200148 A1* | 7/2021 | Park | ..................... | G03H 1/2645 |

FOREIGN PATENT DOCUMENTS

| | | | |
|---|---|---|---|
| CN | 104835720 B | * 9/2017 | ............... B24B 1/00 |
| JP | 2000173961 A | 6/2000 | |
| JP | 2014504004 A | 2/2014 | |
| JP | 2020009864 A | 1/2020 | |
| WO | 2012075249 A1 | 6/2012 | |

OTHER PUBLICATIONS

Japanese Patent Application 2021-086011A: English translation of Office Action, Feb. 4, 2025 (6 pages).

* cited by examiner

*Primary Examiner* — Samuel Park
(74) *Attorney, Agent, or Firm* — Greer, Burns & Crain, Ltd

(57) ABSTRACT

Energy is locally supplied to a cutting surface that is formed in an outer circumferential region of a wafer in a trimming step, before a grinding step of grinding the wafer. This can remove or repair at least part of a damage layer formed in the outer circumferential region of the wafer due to the trimming step. As a result, breakage of the wafer that originates from the outer circumferential region in the grinding of the wafer which has been subjected to the edge trimming and generation of dust in a step after this grinding can be suppressed.

15 Claims, 12 Drawing Sheets

PROCESSING METHOD OF WAFER

BACKGROUND OF THE INVENTION

Field of the Invention

The present invention relates to a processing method of a wafer in which the wafer having an outer circumferential region that is beveled is ground to be thinned.

Description of the Related Art

Chips of devices such as integrated circuits (ICs) and large scale integration (LSI) circuits are constituent elements indispensable in various kinds of electronic equipment such as mobile phones and personal computers. Such chips are manufactured by, for example, forming a large number of devices on a front surface of a wafer composed of a semiconductor material and then dividing the wafer into regions each including the device.

In the wafer used for the manufacturing of the chips, a crack is liable to occur in an outer circumferential region of the wafer on which stress concentrates. Thus, it is general that the outer circumferential region is beveled prior to various steps in the chip manufacturing process. Moreover, in the chip manufacturing process, a back surface of the wafer is ground to thin the wafer prior to dividing of the wafer, in many cases, for the purpose of size reduction of the manufactured chips and so forth.

However, after the back surface of the wafer having the beveled outer circumferential region is ground to thin the wafer, the back surface in the outer circumferential region has a shape like a knife edge. Further, stress concentrates on this part, and a crack is liable to occur at this part. Thus, in the chip manufacturing process, in some cases, after edge trimming is executed to cut and remove part of the outer circumferential region of the wafer on the front surface side, the back surface of the wafer is ground to remove the remaining part of this outer circumferential region (for example, refer to Japanese Patent Laid-open No. 2000-173961).

SUMMARY OF THE INVENTION

In the outer circumferential region of the wafer, a cutting surface is formed due to the edge trimming. Further, when the edge trimming is executed, a damage layer is often formed in the wafer due to such a phenomenon that a cutting trace (periodic recesses and protrusions) is formed in this cutting surface and that dust generated in cutting of the wafer (cutting dust) adheres to the cutting surface in such a manner as to be buried in the wafer.

Such a damage layer has the possibility of becoming the origin of breakage of the wafer in grinding of the wafer after the edge trimming, and has also the possibility of becoming a generation source of dust (cutting dust) in a step after this grinding. In view of this point, an object of the present invention is to provide a processing method of a wafer that can suppress breakage of the wafer in grinding of the wafer which has been subjected to edge trimming and that can suppress generation of dust in a step after this grinding.

In accordance with an aspect of the present invention, there is provided a processing method of a wafer in which the wafer having an outer circumferential region that is beveled is ground to be thinned. The processing method of a wafer includes a trimming step of making a cutting blade cut into the outer circumferential region that is beveled from one surface side of the wafer and annularly cutting the outer circumferential region that is beveled to remove at least part of the outer circumferential region that is beveled, and a cutting surface treatment step of, after execution of the trimming step, locally supplying energy to a cutting surface that is formed in the outer circumferential region in the trimming step.

In the present invention, energy is locally supplied to the cutting surface that is formed in the outer circumferential region of the wafer in the trimming step, before a grinding step of grinding the wafer. This can remove or repair at least part of a damage layer formed in the outer circumferential region of the wafer due to the trimming step. As a result, breakage of the wafer that originates from the outer circumferential region in the grinding of the wafer which has been subjected to the edge trimming and generation of dust in a step after this grinding can be suppressed.

The above and other objects, features and advantages of the present invention and the manner of realizing them will become more apparent, and the invention itself will best be understood from a study of the following description and an appended claim with reference to the attached drawings showing some preferred embodiments of the invention.

BRIEF DESCRIPTION OF THE DRAWINGS

FIG. 11 is a flowchart schematically illustrating a modification example of the processing method of a wafer;

DETAILED DESCRIPTION OF THE PREFERRED EMBODIMENTS

Figure 1A:
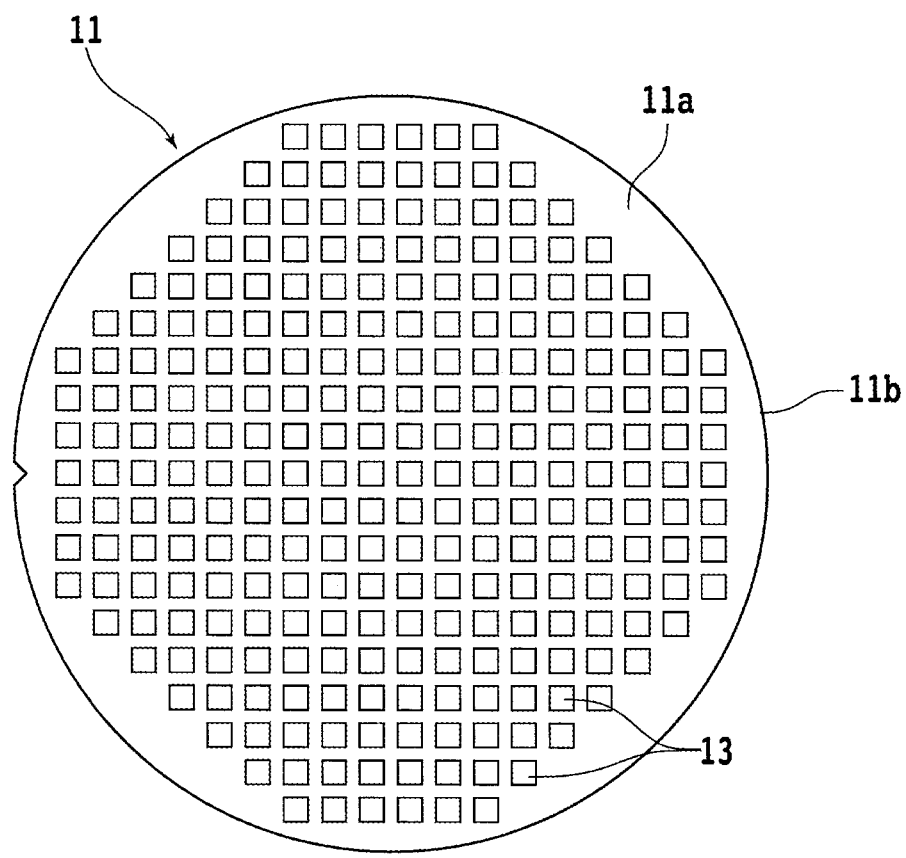
FIG. 1A is a top view schematically illustrating one example of a wafer.
Figure 1B:
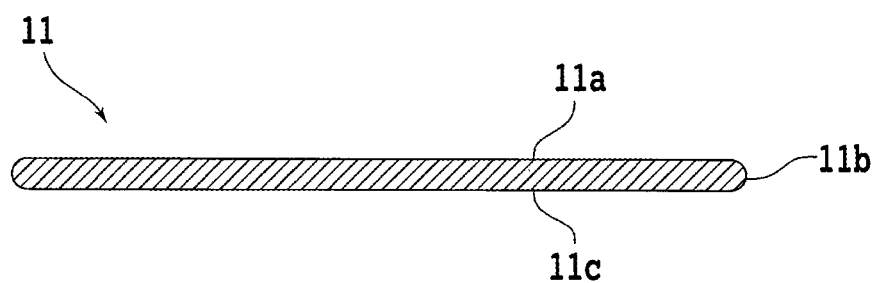
FIG. 1B is a sectional view schematically illustrating the one example of the wafer.

Embodiments of the present invention will be described with reference to the accompanying drawings. FIG. 1A is a top view schematically illustrating one example of a wafer. FIG. 1B is a sectional view schematically illustrating the one example of the wafer. A wafer 11 illustrated in FIG. 1A and FIG. 1B is composed of a semiconductor material such as silicon (Si), for example.

A front surface (one surface) 11a of this wafer 11 is segmented into plural regions by plural planned dividing lines that intersect, and a device 13 such as an IC, an LSI circuit, a semiconductor memory, or a complementary metal oxide semiconductor (CMOS) image sensor is formed in each region.

Moreover, in the wafer 11, a groove or an opening (through-hole that extends from the front surface 11a to a back surface (the other surface) 11c) in which a wiring line such as a through-silicon via (TSV) is disposed may be formed. Further, an outer circumferential region of the wafer 11 is beveled. That is, a side surface 11b of the wafer 11 curves to protrude outward.

Note that there is no limit on the material, shape, structure, size, and so forth of the wafer 11. For example, the wafer 11 may be composed of a semiconductor material other than silicon (for example, composed of silicon carbide (SiC), gallium nitride (GaN), or the like). Similarly, there is no limit also on the kind, quantity, shape, structure, size, arrangement, and so forth of the devices 13.

Further, the wafer 11 may be integrated with a ring frame through a dicing tape in order to make handling thereof easy. For example, the back surface (the other surface) 11c of the wafer 11 may be stuck to a central region of a circular disc-shaped dicing tape with a diameter longer than that of the wafer 11, and a ring frame with an inner diameter longer than that of the diameter of the wafer 11 may be stuck to an outer circumferential region of the dicing tape.

Figure 2:
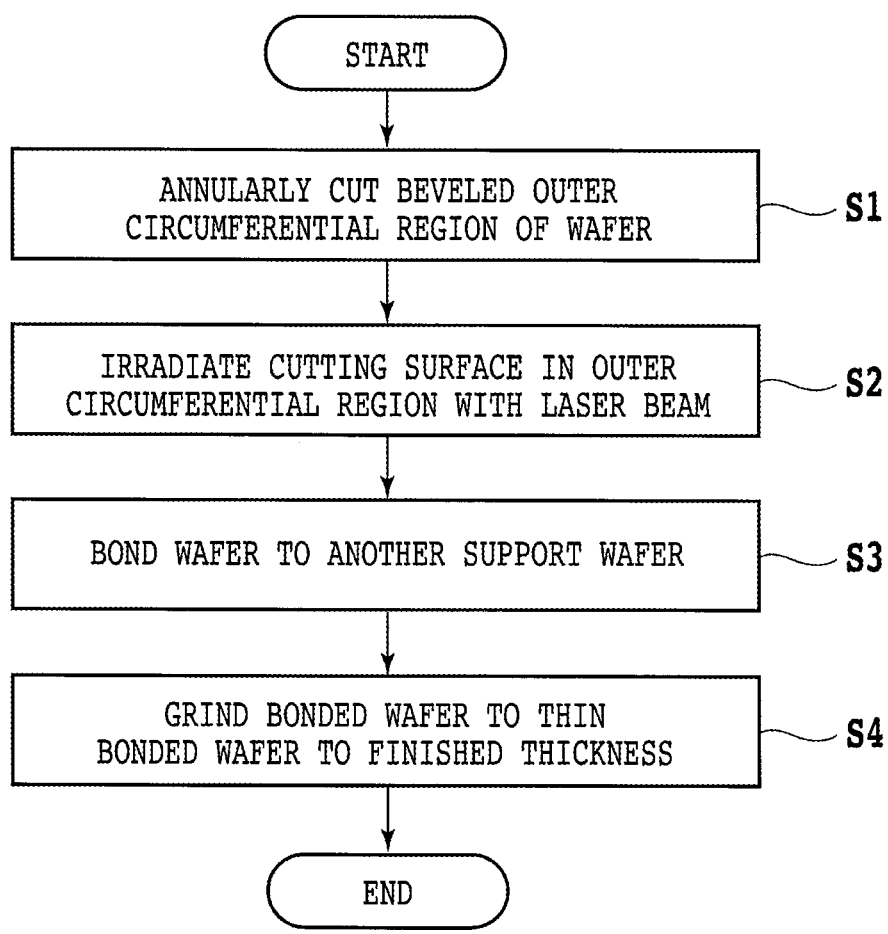
FIG. 2 is a flowchart schematically illustrating one example of a processing method of a wafer.
Figure 3A:
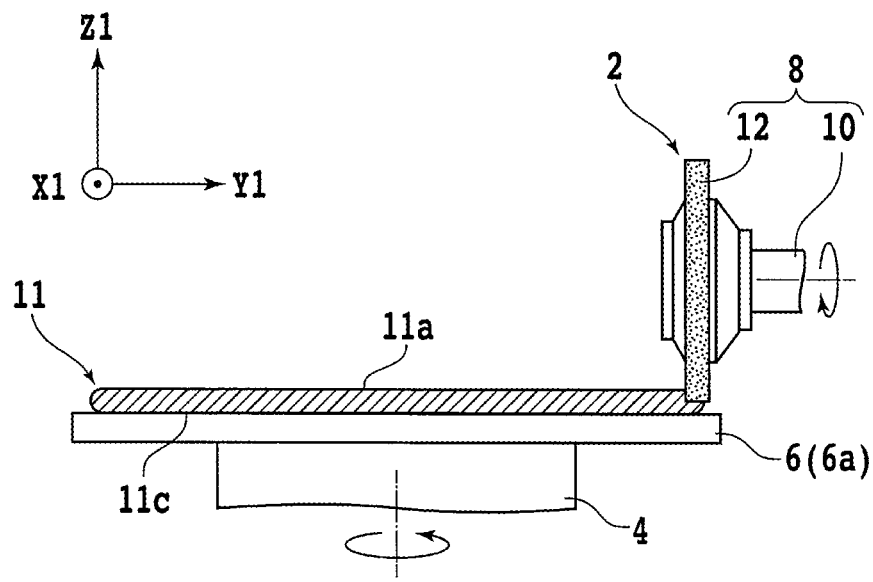
FIG. 3A is a partially sectional side view schematically illustrating the state in which a trimming step is executed for the wafer.

FIG. 2 is a flowchart schematically illustrating one example of a processing method of the wafer 11. In this method, first, a beveled outer circumferential region of the wafer 11 is annularly cut (trimming step: S1). FIG. 3A is a partially sectional side view schematically illustrating the state in which the trimming step (S1) is executed for the wafer 11.

Specifically, FIG. 3A is a partially sectional side view schematically illustrating the state in which the outer circumferential region of the wafer 11 is cut in a cutting apparatus. An X1-axis direction (forward-backward direction) and a Y1-axis direction (left-right direction) illustrated in FIG. 3A are directions perpendicular to each other on the horizontal plane. Further, a Z1-axis direction (upward-downward direction) is a direction (vertical direction) perpendicular to the X1-axis direction and the Y1-axis direction.

A cutting apparatus 2 illustrated in FIG. 3A has a circular columnar θ-table 4. A circular disc-shaped chuck table 6 on which the wafer 11 is placed is disposed on an upper part of this θ-table 4. Further, the θ-table 4 is coupled to a rotational drive source (not illustrated) such as a motor. Moreover, when this rotational drive source is operated, the θ-table 4 and the chuck table 6 rotate around a rotation axis that is a straight line passing through the center of the chuck table 6 and extending along the Z1-axis direction.

The chuck table 6 has a frame body 6a composed of stainless steel or the like. This frame body 6a has a bottom wall with a circular disc shape and a circular annular sidewall disposed upward from the circumferential edge part of this bottom wall. That is, a recess part defined by the bottom wall and the sidewall is formed at an upper part of the frame body 6a.

To this recess part, a circular disc-shaped porous plate (not illustrated) that is composed of a porous ceramic and has substantially the same diameter as the inner diameter of the recess part is fixed. This porous plate is coupled to a suction source (not illustrated) such as a vacuum pump through a flow path formed in the frame body 6a. Further, when this suction source is operated, the pressure applied to a space near an upper surface of the porous plate (holding surface of the chuck table 6) becomes a negative pressure.

Thus, the wafer 11 can be held under suction by the chuck table 6 when the suction source is operated in the state in which the wafer 11 is placed on the holding surface of the chuck table 6. Moreover, the θ-table 4 and the chuck table 6 are coupled to an X1-axis direction movement mechanism (not illustrated). Further, the θ-table 4 and the chuck table 6 move along the X1-axis direction when this X1-axis direction movement mechanism is operated.

A cutting unit 8 is disposed over the chuck table 6. The cutting unit 8 is coupled to a Y1-axis direction movement mechanism (not illustrated) and a Z1-axis direction movement mechanism (not illustrated). Moreover, the cutting unit 8 moves along the Y1-axis direction when this Y1-axis direction movement mechanism is operated. Further, the cutting unit 8 moves along the Z1-axis direction when this Z1-axis direction movement mechanism is operated.

The cutting unit 8 has a circular columnar spindle 10 that extends in the Y1-axis direction. A cutting blade 12 having a circular annular cutter is mounted on one end part (tip part) of the spindle 10. For example, the cutting blade 12 is a hub-type cutting blade formed by integrating a circular annular base composed of metal or the like and a circular annular cutter arranged along the outer circumferential edge of the base.

The cutter of the hub-type cutting blade includes an electroformed abrasive stone in which abrasive grains composed of diamond, cubic boron nitride (cBN), or the like are fixed by a binder of nickel or the like. Further, a washer-type cutting blade including a circular annular cutter in which abrasive grains are fixed by a binder composed of metal, ceramic, resin, or the like may be used as the cutting blade 12.

Moreover, the other end part (base end part) of the spindle 10 is coupled to a rotational drive source (not illustrated) such as a motor. Further, when this rotational drive source is operated, the cutting blade 12 rotates together with the spindle 10 around a rotation axis that is a straight line extending along the Y1-axis direction. In addition, a nozzle (not illustrated) that supplies a liquid (cutting water) to a region of the wafer 11 to be cut is disposed near this cutting blade 12.

In this cutting apparatus 2, the trimming step (S1) is executed in the following order, for example. First, the X1-axis direction movement mechanism moves the chuck table 6 along the X1-axis direction to position the chuck table 6 to a position that is separate from the cutting blade 12 and at which the wafer 11 can be carried in to the holding surface of the chuck table 6.

Subsequently, the wafer 11 is carried in to the holding surface of the chuck table 6 with the front surface 11a oriented upward, and thereafter, the suction source is operated to cause the back surface 11c of the wafer 11 to be held under suction by the chuck table 6. Next, the Y1-axis direction movement mechanism moves the cutting unit 8 along the Y1-axis direction such that part of the outer circumferential region of the wafer 11 located in the Y1-axis direction as viewed from the center of the wafer 11 is disposed in the X1-axis direction as viewed from the cutting blade 12.

Subsequently, the Z1-axis direction movement mechanism lowers the cutting unit 8 to position the lowermost end of the cutting blade 12 to a position that is lower than the front surface 11a of the wafer 11 but is higher than the back surface 11c.

Next, the rotational drive source coupled to the other end part of the spindle 10 rotates the cutting blade 12 together with the spindle 10. Subsequently, the cutting blade 12 is made to cut into the wafer 11 while the liquid (cutting water) is supplied from the nozzle disposed near the cutting blade 12 to the vicinity of the lowermost end of the cutting blade 12.

Specifically, the X1-axis direction movement mechanism moves the chuck table 6 along the X1-axis direction until the lowermost end of the cutting blade 12 reaches the part of the outer circumferential region of the wafer 11 located in the Y1-axis direction as viewed from the center of the wafer 11. Next, with the cutting blade 12 being rotated, the rotational drive source coupled to the θ-table 4 is operated to make at least one revolution of the chuck table 6.

Figure 3B:
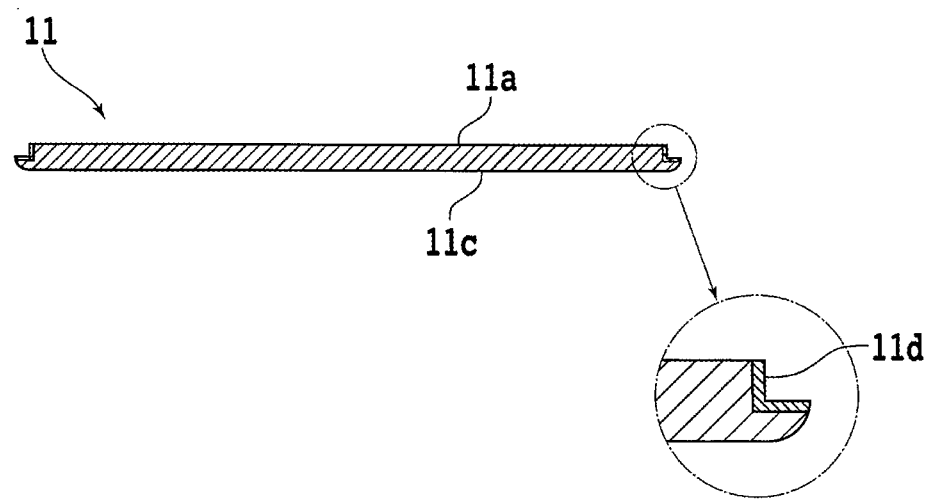
FIG. 3B is a sectional view schematically illustrating one example of the wafer that has been undergone the trimming step.

Thus, the outer circumferential region of the wafer 11 is annularly cut. FIG. 3B is a sectional view schematically illustrating the wafer 11 after the execution of the trimming step (S1). By this trimming step (S1), part of the beveled outer circumferential region of the wafer 11 on the front surface 11a side is removed.

At this time, a damage layer 11d is formed in the vicinity of a cutting surface, which is formed in the trimming step (S1), in the outer circumferential region of the wafer 11. This damage layer 11d is a layer that has a cutting trace (periodic recesses and protrusions) formed in the surface thereof (cutting surface) and/or has cutting dust, which is generated in the trimming step (S1), adhering to the cutting surface in such a manner as to be buried in the wafer.

Figure 4A:
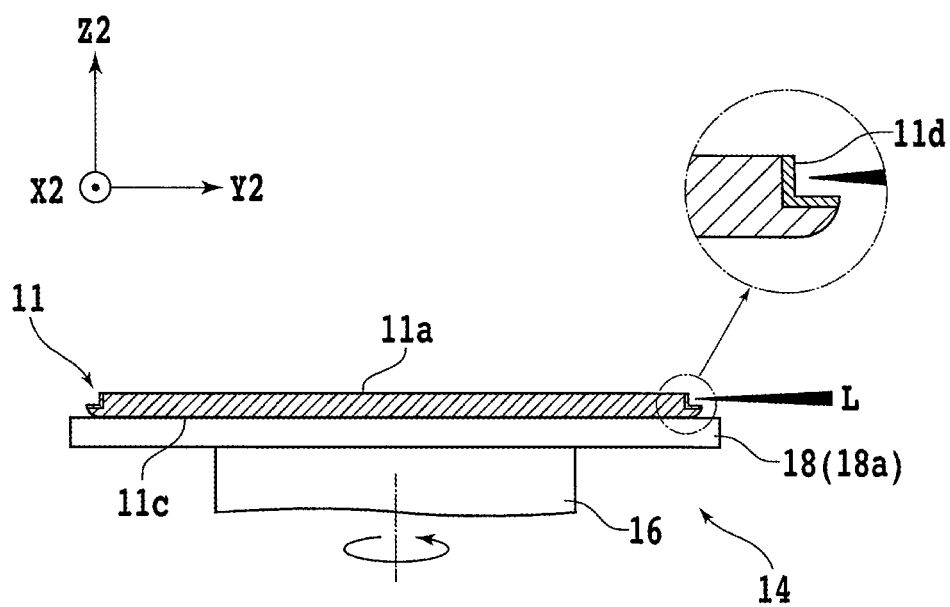
FIG. 4A is a partially sectional side view schematically illustrating the state in which a cutting surface treatment step is executed for the wafer.

In the method illustrated in FIG. 2, after the execution of the trimming step (S1), the cutting surface in the outer circumferential region of the wafer 11 is irradiated with a laser beam (cutting surface treatment step: S2). FIG. 4A is a partially sectional side view schematically illustrating the state in which the cutting surface treatment step (S2) is executed for the wafer 11.

Specifically, FIG. 4A is a partially sectional side view schematically illustrating the state in which the cutting surface (surface of the damage layer 11d) in the outer circumferential region of the wafer 11 is irradiated with a laser beam L in a laser processing apparatus. An X2-axis direction (forward-backward direction) and a Y2-axis direction (left-right direction) illustrated in FIG. 4A are directions perpendicular to each other on the horizontal plane. Further, a Z2-axis direction (upward-downward direction) is a direction (vertical direction) perpendicular to the X2-axis direction and the Y2-axis direction.

A laser processing apparatus 14 illustrated in FIG. 4A has a circular columnar θ-table 16. A circular disc-shaped chuck table 18 on which the wafer 11 is placed is disposed on an upper part of this θ-table 16.

Further, the θ-table 16 is coupled to a rotational drive source (not illustrated) such as a motor. Moreover, when this rotational drive source is operated, the θ-table 16 and the chuck table 18 rotate around a rotation axis that is a straight line passing through the center of the chuck table 18 and extending along the Z2-axis direction.

The chuck table 18 has a frame body 18a composed of stainless steel or the like. This frame body 18a has a bottom wall with a circular disc shape and a circular annular sidewall disposed upward from the circumferential edge part of this bottom wall. That is, a recess part defined by the bottom wall and the sidewall is formed at an upper part of the frame body 18a.

To this recess part, a circular disc-shaped porous plate (not illustrated) that is composed of a porous ceramic and has substantially the same diameter as the inner diameter of the recess part is fixed. This porous plate is coupled to a suction source (not illustrated) such as a vacuum pump through a flow path formed in the frame body 18a.

Further, when this suction source is operated, the pressure applied to a space near an upper surface of the porous plate (holding surface of the chuck table 18) becomes a negative pressure. Thus, the wafer 11 can be held under suction by the chuck table 18 when the suction source is operated in the state in which the wafer 11 is placed on the holding surface of the chuck table 18.

A laser beam irradiation unit (not illustrated) is disposed on a lateral side of the chuck table 18. This laser beam irradiation unit has Nd:YAG or the like as a laser medium and executes irradiation with the laser beam L with such a wavelength (for example, 355 nm) as to be absorbed by the wafer, along a direction perpendicular to the Z2-axis direction.

Moreover, the laser beam irradiation unit is coupled to a Z2-axis direction movement mechanism (not illustrated). Further, the laser beam irradiation unit moves along the Z2-axis direction when this Z2-axis direction movement mechanism is operated.

In this laser processing apparatus 14, the cutting surface treatment step (S2) is executed in the following order, for example. First, the wafer 11 is carried in to the holding surface of the chuck table 18 with the front surface 11a oriented upward, and thereafter, the suction source is operated to cause the back surface 11c of the wafer 11 to be held under suction by the chuck table 18.

Subsequently, the Z2-axis direction movement mechanism adjusts the position of the laser beam irradiation unit such that the cutting surface (surface of the damage layer 11d), which is formed in the trimming step (S1), in the outer circumferential region of the wafer 11 is positioned in the irradiation direction of the laser beam L as viewed from the laser beam irradiation unit.

Next, the laser beam irradiation unit executes irradiation with the laser beam L while the chuck table 18 is rotated. Moreover, this irradiation with the laser beam L may be executed while the Z2-axis direction movement mechanism moves the position of the laser beam irradiation unit. Thus, for example, laser ablation occurs in the damage layer 11d irradiated with the laser beam L.

Figure 4B:
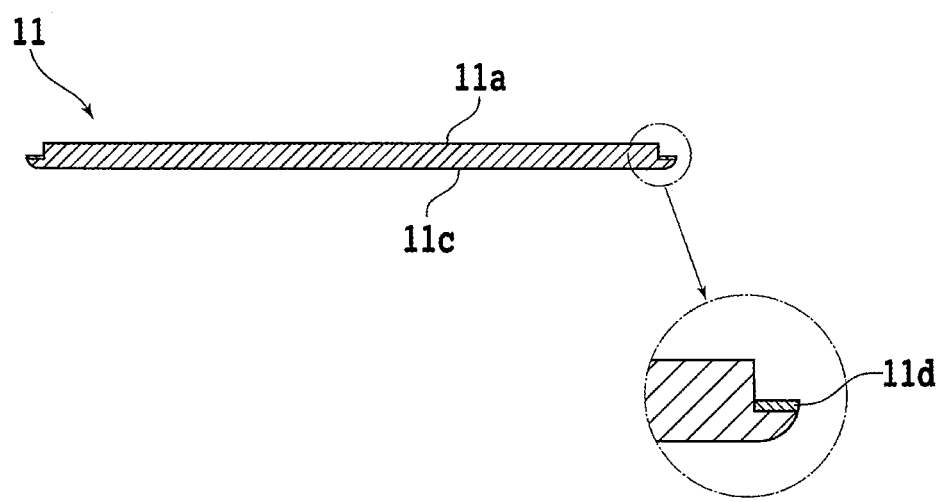
FIG. 4B is a sectional view schematically illustrating one example of the wafer that has been undergone the cutting surface treatment step.

As a result, at least part of the damage layer 11d is removed. FIG. 4B is a sectional view schematically illustrating the wafer 11 after the execution of the cutting surface treatment step (S2). By this cutting surface treatment step (S2), a part of the damage layer 11d that extends along the thickness direction of the wafer 11 (Z2-axis direction) is removed, for example.

Alternatively, this irradiation with the laser beam L may be executed while the angle of incidence of the laser beam L on the damage layer 11d (irradiation direction of the laser beam L) is varied. This can remove the whole of the damage layer 11d, for example.

Note that, in the cutting surface treatment step (S2), the damage layer 11d does not have to be removed. That is, in the cutting surface treatment step (S2), it suffices that the damage layer 11d can be repaired in order to suppress breakage of the wafer 11 in grinding of the wafer 11 and generation of dust in a step after this grinding.

For example, in the cutting surface treatment step (S2), the damage layer 11d may be irradiated with the laser beam L in such a manner that the damage layer 11d slightly melts and then immediately solidifies. This can smooth the surface of the damage layer 11d (cutting surface) and anchor dust (cutting dust) that adheres to the cutting surface in such a manner as to be buried in the wafer 11.

Moreover, in order to repair the damage layer 11d, the irradiation with the laser beam L may be executed while the Z2-axis direction movement mechanism moves the position of the laser beam irradiation unit, or may be executed while the angle of incidence of the laser beam L on the damage layer 11d is varied. It is preferable to set the output power of the laser beam L to 1 to 30 W, for example, to remove or repair the damage layer 11d as above.

Figure 5:
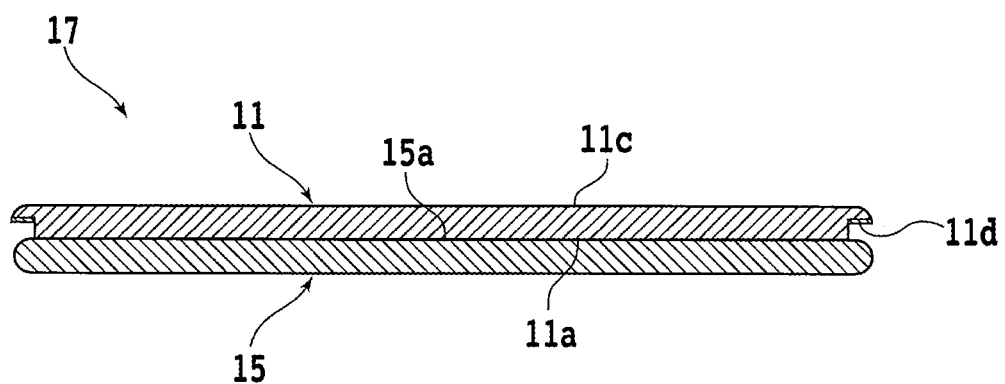
FIG. 5 is a sectional view schematically illustrating one example of a bonded wafer obtained in a bonding step after the cutting surface treatment step.

In the method illustrated in FIG. 2, after the execution of the cutting surface treatment step (S2), the wafer 11 is bonded to another support wafer (bonding step: S3). FIG. 5 is a sectional view schematically illustrating one example of the wafer 11 bonded to the support wafer (bonded wafer).

In the bonding step (S3), for example, a bonded wafer 17 is formed by bonding the front surface 11a of the wafer 11 to a front surface 15a of a support wafer 15 with the interposition of an adhesive. This support wafer 15 has a diameter substantially equal to that of the wafer 11 and is composed of, for example, a semiconductor material such as silicon.

Further, the support wafer 15 may be a bare wafer or may be a wafer on which some kind of devices are formed. For example, when a CMOS image sensor of the back side illumination (BSI) type is manufactured by using this bonded wafer 17, a circuit for pixels of the image sensor may be formed in the support wafer 15. In addition, an outer circumferential region of the support wafer 15 is beveled.

Figure 6A:
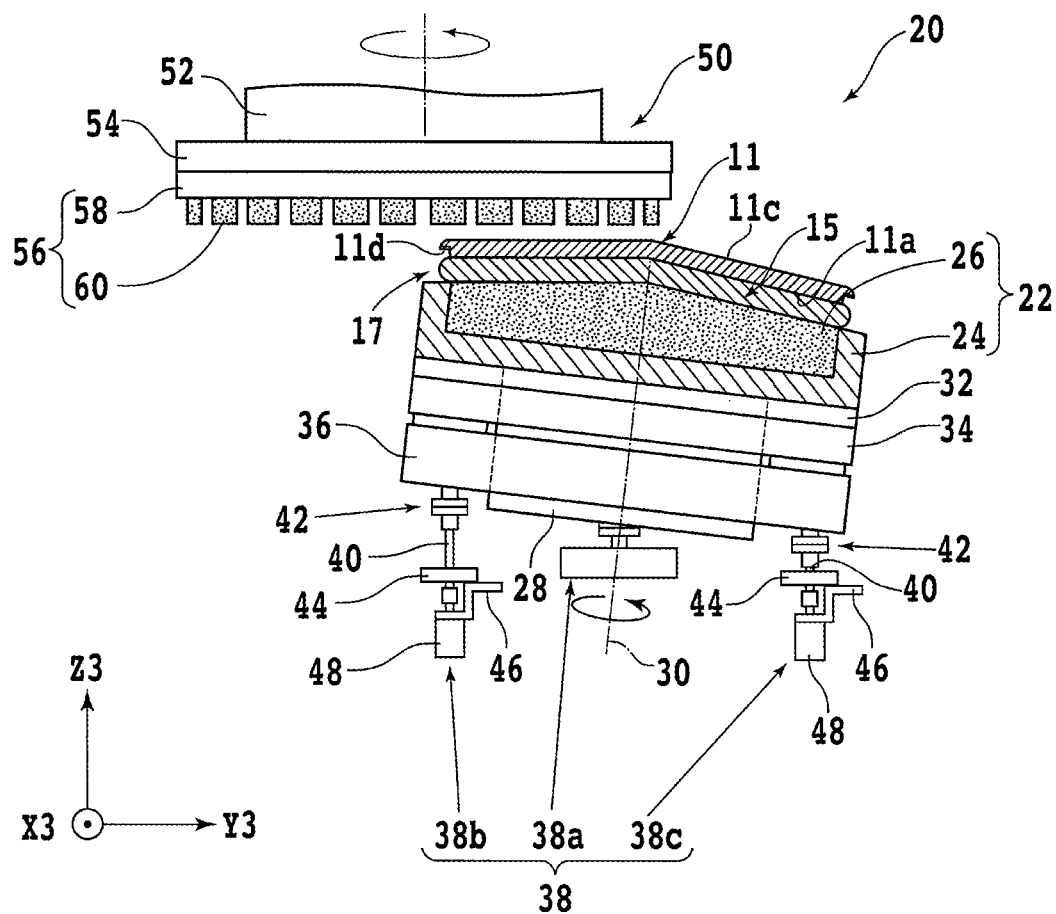
FIG. 6A is a partially sectional side view schematically illustrating the state in which a grinding step is executed for the bonded wafer.

In the method illustrated in FIG. 2, after the execution of the bonding step (S3), the bonded wafer 17 is ground to be thinned to a finished thickness (grinding step: S4). FIG. 6A is a partially sectional side view schematically illustrating the state in which the grinding step (S4) is executed for the bonded wafer 17.

Specifically, FIG. 6A is a partially sectional side view schematically illustrating the state in which the back surface 11c of the wafer 11 is ground in a grinding apparatus. An X3-axis direction (forward-backward direction) and a Y3-axis direction (left-right direction) illustrated in FIG. 6A are directions perpendicular to each other on the horizontal plane. Further, a Z3-axis direction (upward-downward direction) is a direction (vertical direction) perpendicular to the X3-axis direction and the Y3-axis direction.

A grinding apparatus 20 illustrated in FIG. 6A has a chuck table 22 with a circular disc shape. This chuck table 22 has a frame body 24 composed of ceramic or the like. This frame body 24 has a bottom wall with a circular disc shape and a circular annular sidewall disposed upward from the circumferential edge part of this bottom wall. That is, a recess part defined by the bottom wall and the sidewall is formed at an upper part of the frame body 24.

To this recess part, a circular disc-shaped porous plate 26 that is formed of a porous ceramic and that has a diameter substantially equal to the inner diameter of the recess part is fixed. A lower surface of this porous plate 26 is substantially flat, and an upper surface thereof has a shape in which the central part slightly protrudes compared with the outer circumferential part, i.e. a shape equivalent to the side surface of a cone.

Moreover, the porous plate 26 is coupled to a suction source (not illustrated) such as a vacuum pump through a flow path formed in the frame body 24. Further, when this suction source is operated, the pressure applied to a space near the upper surface of the porous plate 26 (holding surface of the chuck table 22) becomes a negative pressure.

Thus, the bonded wafer 17 can be held under suction by the chuck table 22 when the suction source is operated in the state in which the bonded wafer 17 is placed on the holding surface of the chuck table 22. In addition, an upper part of a circular columnar spindle 28 is coupled to a lower part of the chuck table 22. The chuck table 22 can be detached from the spindle 28.

A lower part of this spindle 28 is coupled to a rotational drive source (not illustrated) such as a motor. Further, when this rotational drive source is operated, the chuck table 22 rotates around a rotation axis 30 that passes through the center of the holding surface of the chuck table 22. That is, the chuck table 22 rotates along the circumferential direction of its holding surface.

An annular bearing 32 that supports the chuck table 22 is disposed on the lower part of the chuck table 22. An annular support plate 34 is fixed to a lower part of the bearing 32. Moreover, the bearing 32 supports the chuck table 22 in such a manner that the chuck table 22 can rotate relative to the support plate 34. An annular table base 36 is disposed under the support plate 34.

The spindle 28 is located in an opening made at the center of the bearing 32, the center of the support plate 34, and the center of the table base 36. On a lower surface of the table base 36, three support mechanisms (fixed support mechanism 38a, first movable support mechanism 38b, and second movable support mechanism 38c) are disposed. The three support mechanisms are spaced from each other and are arranged along the circumferential direction of the lower surface of the table base 36. In the present specification, these three support mechanisms are collectively referred to as a tilt adjustment unit 38.

The table base 36 is supported by the fixed support mechanism 38a, the first movable support mechanism 38b, and the second movable support mechanism 38c. The fixed support mechanism 38a has a support column (fixed shaft) with a predetermined length. An upper part of this support column supports an upper part support body fixed to the lower surface of the table base 36, and a lower part of this support column is fixed to a support base.

The first movable support mechanism 38b and the second movable support mechanism 38c each have a support column (movable shaft) 40. The support column 40 has a male screw formed at a tip part thereof. The tip part (upper part) of the support column 40 is rotatably coupled to an upper part support body 42 fixed to the lower surface of the table base 36. More specifically, the upper part support body 42 is a columnar member made of metal, such as a rod, and has a female screw, and the male screw of the support column 40 is rotatably coupled to the female screw of the upper part support body 42.

Circular annular bearings 44 having a predetermined outer diameter are fixed to the outer circumferences of the support columns 40 of the first movable support mechanism 38b and the second movable support mechanism 38c. The bearings 44 are partially supported by staircase-shaped support plates 46. That is, the first movable support mechanism 38b and the second movable support mechanism 38c are supported by the support plates 46.

Motors 48 that rotate the support columns 40 are coupled to lower parts of the support columns 40. When the motor 48 is operated to rotate the support column 40 in one direction, the upper part support body 42 rises. Further, when the motor 48 is operated to rotate the support column 40 in the other direction, the upper part support body 42 lowers. The tilt of the table base 36 (i.e. chuck table 22) is adjusted through rising and lowering of the upper part support bodies 42 of the first movable support mechanism 38b and the second movable support mechanism 38c in this manner.

Moreover, the chuck table 22 is coupled to a horizontal direction movement mechanism (not illustrated). Further, the chuck table 22 moves in the direction perpendicular to the Z3-axis direction when this horizontal direction movement mechanism is operated.

A grinding unit 50 is disposed over the chuck table 22. The grinding unit 50 is coupled to a Z3-axis direction movement mechanism (not illustrated). Moreover, the grinding unit 50 moves along the Z3-axis direction when this Z3-axis direction movement mechanism is operated. Further, the grinding unit 50 has a circular columnar spindle 52 that extends in the Z3-axis direction.

An upper surface of a circular disc-shaped wheel mount 54 composed of stainless steel or the like is fixed to a lower end part (tip part) of this spindle 52. A circular annular grinding wheel 56 with a diameter substantially equal to that of the wheel mount 54 is detachably mounted on a lower part of the wheel mount 54.

The grinding wheel 56 has a circular annular wheel base 58. The wheel base 58 is composed of stainless steel or the like, for example. On a lower surface of the wheel base 58, plural grinding abrasive stones 60 are discretely disposed along the circumferential direction of this lower surface. Lower surfaces of the plural grinding abrasive stones 60 are disposed at substantially the same height in the Z3-axis direction.

Further, an upper end part (base end part) of the spindle 52 is coupled to a rotational drive source (not illustrated) such as a motor. Moreover, when this rotational drive source is operated, the grinding wheel 56 rotates together with the spindle 52 around a rotation axis that is a straight line passing through the center of the spindle 52 and extending along the Z3-axis direction. In addition, a nozzle (not illustrated) that supplies a liquid (grinding water) to a region of the wafer 11 to be ground is disposed near this grinding wheel 56.

In this grinding apparatus 20, the grinding step (S4) is executed in the following order, for example. First, the horizontal direction movement mechanism moves the chuck table 22 to position the chuck table 22 to a position that is separate from the grinding wheel 56 and at which the bonded wafer 17 can be carried in to the holding surface of the chuck table 22.

Subsequently, the bonded wafer 17 is carried in to the holding surface of the chuck table 22 with the back surface 11c of the wafer 11 oriented upward, and thereafter, the suction source is operated to cause the support wafer 15 to be held under suction by the chuck table 22.

Next, the tilt of the chuck table 22 is adjusted. Specifically, the tilt adjustment unit 38 adjusts the tilt of the chuck table 22 in such a manner that a line segment that links the highest point in the points on the outer circumference of the holding surface of the chuck table 22 and the center of the holding surface becomes perpendicular to the Z3-axis direction. That is, the tilt adjustment unit 38 adjusts the tilt of the chuck table 22 to cause this line segment to become parallel to the lower surfaces of the plural grinding abrasive stones 60. Note that, when this line segment has become perpendicular to the Z3-axis direction in advance, the adjustment of the tilt of the chuck table 22 is omitted.

Subsequently, the horizontal direction movement mechanism moves the chuck table 22 such that the locus of the plural grinding abrasive stones 60 of the grinding wheel 56 being rotated overlaps with one end and the other end of the above-described line segment in plan view. Next, the rotational drive source coupled to the upper end part of the spindle 52 rotates the grinding wheel 56 together with the spindle 52, and the rotational drive source coupled to the lower part of the spindle 28 rotates the chuck table 22 together with the spindle 28.

Next, the Z3-axis direction movement mechanism lowers the grinding unit 50 to bring the lower surfaces of the plural grinding abrasive stones 60 into contact with the back surface 11c of the wafer 11 while the liquid (grinding water) is supplied from the nozzle disposed near the grinding wheel 56 to the back surface 11c of the wafer 11. Thus, part of the back surface 11c of the wafer 11 is ground to be removed. Moreover, with the grinding wheel 56 and the chuck table 22 being rotated, the Z3-axis direction movement mechanism lowers the grinding unit 50 until the bonded wafer 17 is thinned to the finished thickness.

Figure 6B:
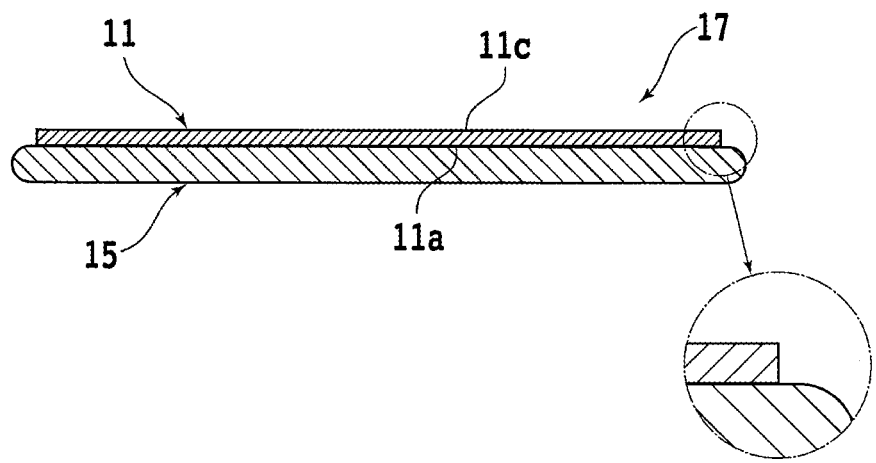
FIG. 6B is a sectional view schematically illustrating one example of the bonded wafer that has been undergone the grinding step.

As a result, the beveled part of the outer circumferential region of the wafer 11 that remains on the back surface 11c side is removed. FIG. 6B is a sectional view schematically illustrating the bonded wafer 17 after the execution of the grinding step (S4). By this grinding step (S4), for example, a part of the damage layer 11d that extends in parallel to the back surface 11c is removed as well as the beveled part of the outer circumferential region of the wafer 11 that remains on the back surface 11c side.

In the method illustrated in FIG. 2, the cutting surface (surface of the damage layer 11d), which is formed in the trimming step (S1), in the outer circumferential region of the wafer 11 is irradiated with the laser beam L before the grinding step (S4) of grinding the wafer 11. This can remove or repair part of the damage layer 11d formed in the outer circumferential region of the wafer 11 by the trimming step (S1). As a result, breakage of the wafer 11 that originates from the outer circumferential region in the grinding step (S4) and generation of dust in a step after the grinding step (S4) can be suppressed.

Figure 7:
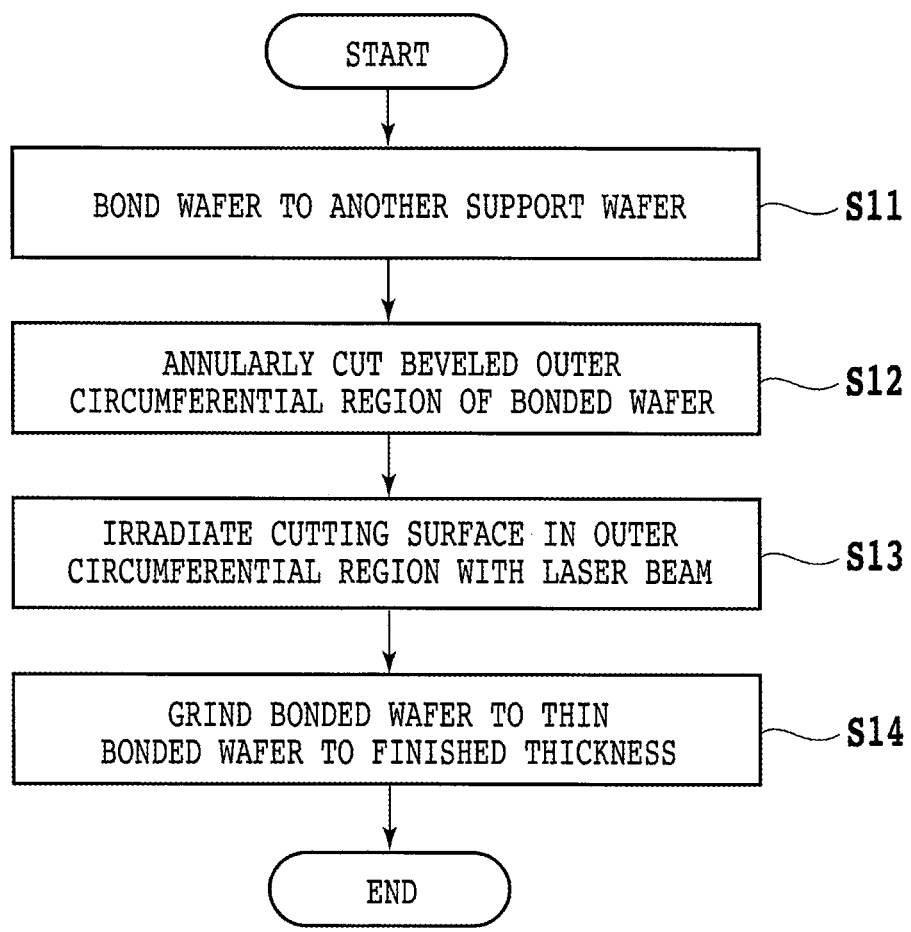
FIG. 7 is a flowchart schematically illustrating a modification example of the processing method of a wafer.

Note that the above-described method is one aspect of the present invention, and the present invention is not limited to the above-described method. For example, in the processing method of a wafer according to the present invention, the bonding step may be executed prior to the trimming step and the cutting surface treatment step. FIG. 7 is a flowchart schematically illustrating one example of such a processing method of a wafer.

Figure 8:
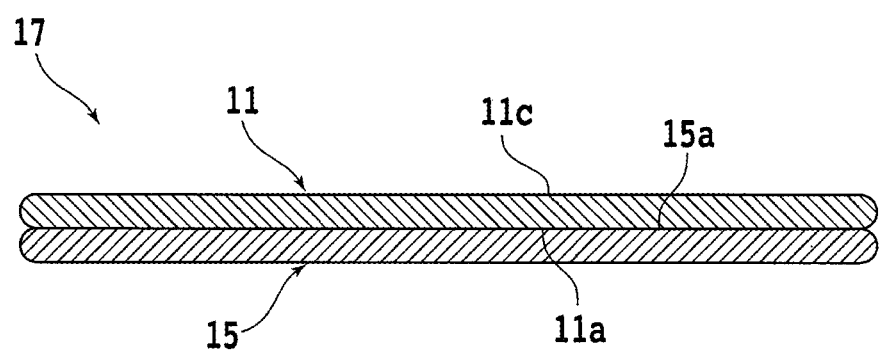
FIG. 8 is a sectional view schematically illustrating one example of the bonded wafer obtained in a bonding step before a trimming step.

In this method, first, the wafer 11 is bonded to another support wafer 15 (bonding step: S11). FIG. 8 is a sectional view schematically illustrating one example of the wafer 11 bonded to the support wafer 15 (bonded wafer 17). This bonding step (S11) is executed similarly to the above-described bonding step (S3), and therefore, the above description is incorporated here.

Figure 9A:
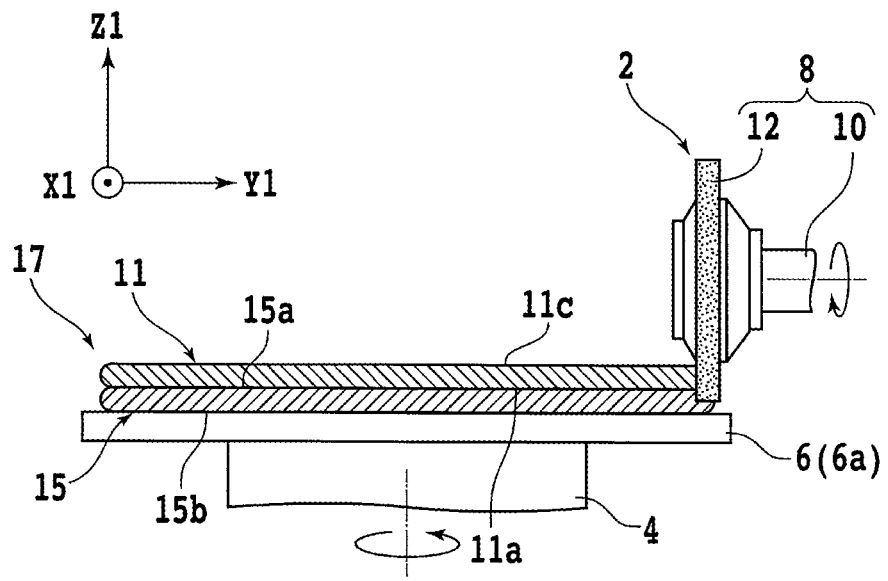
FIG. 9A is a partially sectional side view schematically illustrating the state in which the trimming step is executed for the bonded wafer.

In the method illustrated in FIG. 7, after the execution of the bonding step (S11), a beveled outer circumferential region of the bonded wafer 17 (wafer 11 and support wafer 15) is annularly cut (trimming step: S12). FIG. 9A is a partially sectional side view schematically illustrating the state in which the trimming step (S12) is executed for the bonded wafer 17. Note that, regarding the cutting apparatus 2 used in the trimming step (S12), the above description is incorporated.

This trimming step (S12) is executed in the following order, for example. First, the X1-axis direction movement mechanism moves the chuck table 6 along the X1-axis direction to position the chuck table 6 to a position that is separate from the cutting blade 12 and at which the bonded wafer 17 can be carried in to the holding surface of the chuck table 6.

Subsequently, the bonded wafer 17 is carried in to the holding surface of the chuck table 6 with the back surface 11c of the wafer 11 oriented upward, and thereafter, the suction source is operated to cause a back surface 15b of the support wafer 15 to be held under suction by the chuck table 6. Next, the Y1-axis direction movement mechanism moves the cutting unit 8 along the Y1-axis direction such that part of the outer circumferential region of the bonded wafer 17 located in the Y1-axis direction as viewed from the center of the bonded wafer 17 is disposed in the X1-axis direction as viewed from the cutting blade 12.

Subsequently, the Z1-axis direction movement mechanism lowers the cutting unit 8 to position the lowermost end of the cutting blade 12 to a position that is lower than the front surface 15a of the support wafer 15 but is higher than the back surface 15b.

Next, the rotational drive source coupled to the other end part of the spindle 10 rotates the cutting blade 12 together with the spindle 10. Subsequently, the cutting blade 12 is made to cut into the bonded wafer 17 while the liquid (cutting water) is supplied from the nozzle disposed near the cutting blade 12 to the vicinity of the lowermost end of the cutting blade 12.

Specifically, the X1-axis direction movement mechanism moves the chuck table 6 along the X1-axis direction until the lowermost end of the cutting blade 12 reaches the part of the outer circumferential region of the bonded wafer 17 located in the Y1-axis direction as viewed from the center of the bonded wafer 17. Next, with the cutting blade 12 being rotated, the rotational drive source coupled to the θ-table 4 is operated to make at least one revolution of the chuck table 6.

Figure 9B:
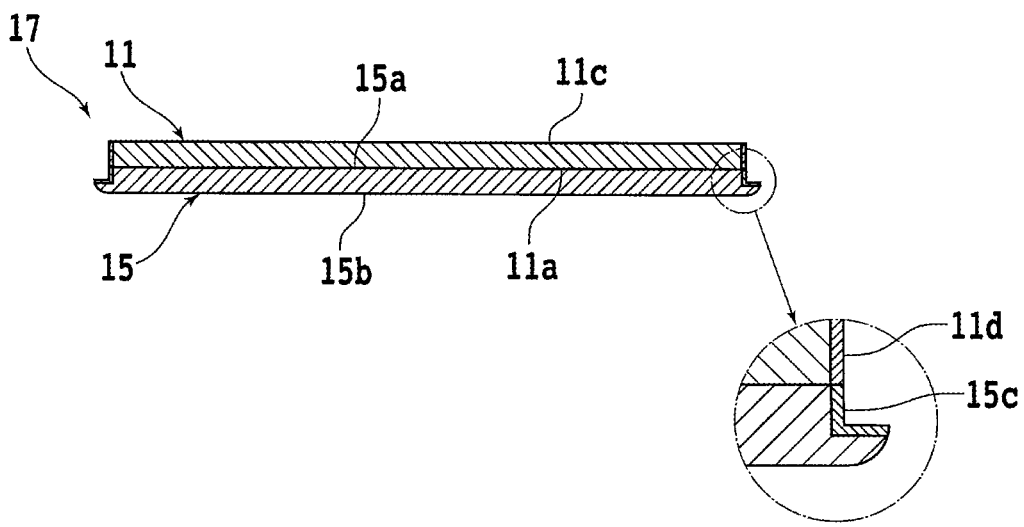
FIG. 9B is a sectional view schematically illustrating the bonded wafer that has been undergone the trimming step.

Thus, the outer circumferential region of the bonded wafer 17 is annularly cut. FIG. 9B is a sectional view schematically illustrating the bonded wafer 17 after the execution of the trimming step (S12). By this trimming step (S12), the whole of the beveled outer circumferential region of the wafer 11 and part of the beveled outer circumferential region of the support wafer 15 on the front surface 15a side are removed.

At this time, the damage layer 11d is formed in the vicinity of the cutting surface, which is formed in the trimming step (S12), in the outer circumferential region of the wafer 11, and a damage layer 15c is formed in the vicinity of the cutting surface in the outer circumferential region of the support wafer 15.

Figure 10A:
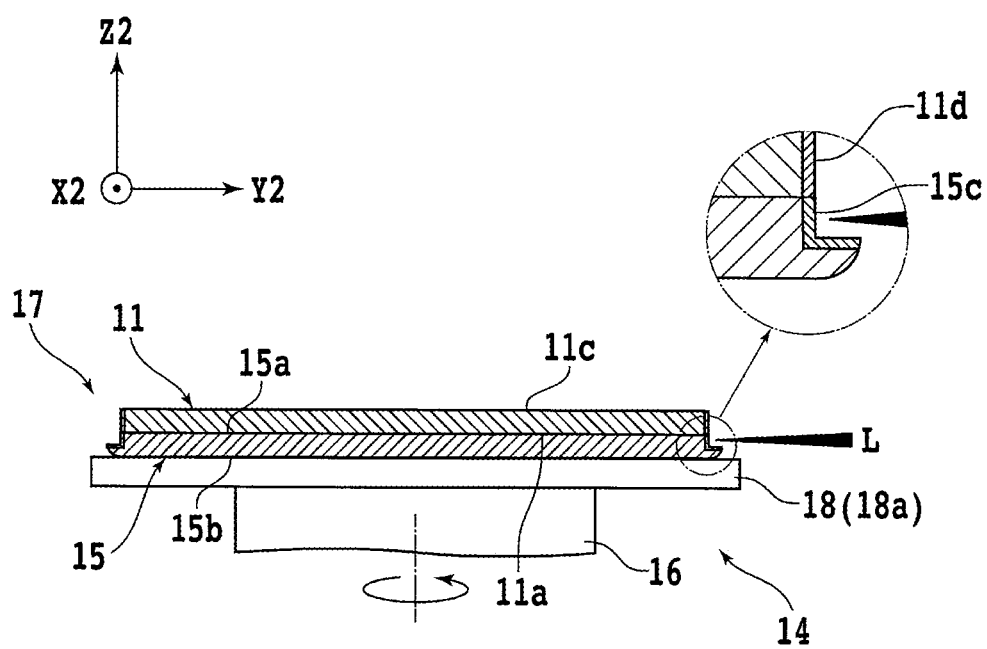
FIG. 10A is a partially sectional side view schematically illustrating the state in which a cutting surface treatment step is executed for the bonded wafer.

In the method illustrated in FIG. 7, after the execution of the trimming step (S12), the cutting surface in the outer circumferential region of the bonded wafer 17 (wafer 11 and support wafer 15) is irradiated with a laser beam (cutting surface treatment step: S13). FIG. 10A is a partially sectional side view schematically illustrating the state in which the cutting surface treatment step (S13) is executed for the bonded wafer 17. Note that, regarding the laser processing apparatus 14 used in the cutting surface treatment step (S13), the above description is incorporated.

This cutting surface treatment step (S13) is executed in the following order, for example. First, the bonded wafer 17 is carried in to the holding surface of the chuck table 18 with the back surface 11c of the wafer 11 oriented upward, and thereafter, the suction source is operated to cause the back surface 15b of the support wafer 15 to be held under suction by the chuck table 18.

Subsequently, the Z2-axis direction movement mechanism adjusts the position of the laser beam irradiation unit such that the cutting surface (surfaces of the damage layer 11d and the damage layer 15c), which is formed in the trimming step (S12), in the outer circumferential region of the bonded wafer 17 is positioned in the irradiation direction of the laser beam L as viewed from the laser beam irradiation unit.

Next, the laser beam irradiation unit executes irradiation with the laser beam L while the chuck table 18 is rotated. Moreover, this irradiation with the laser beam L may be executed while the Z2-axis direction movement mechanism moves the position of the laser beam irradiation unit. Thus, for example, laser ablation occurs in the damage layer 11d and the damage layer 15c that are irradiated with the laser beam L.

Further, this irradiation with the laser beam L is executed while the angle of incidence of the laser beam L on the damage layer 11d and the damage layer 15c (irradiation direction of the laser beam L) is varied. This can remove the whole of the damage layer 11d and the damage layer 15c, for example.

Figure 10B:
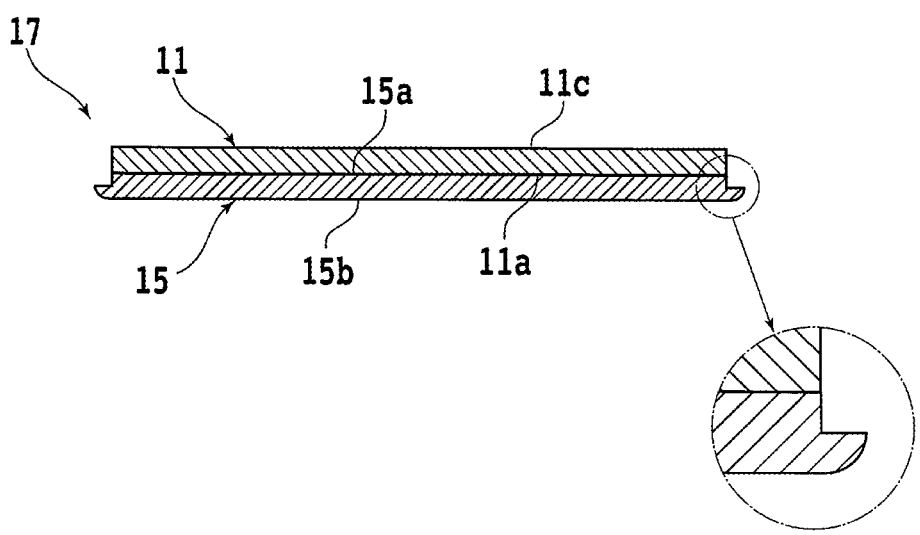
FIG. 10B is a sectional view schematically illustrating the bonded wafer that has been undergone the cutting surface treatment step.
Figure 1:
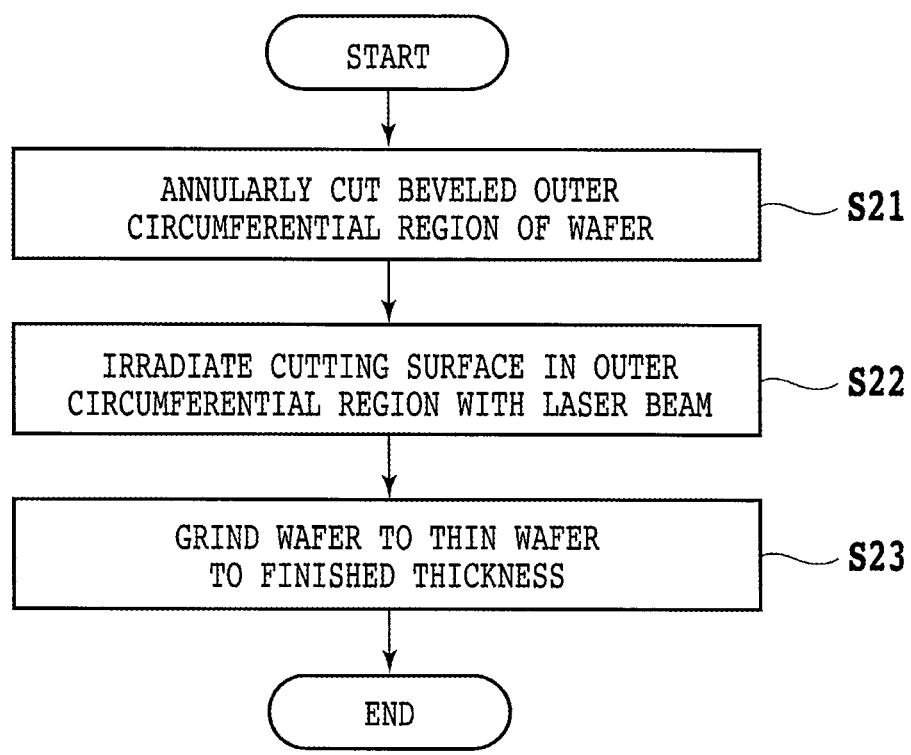

As a result, the whole of the damage layer 11d and the damage layer 15c is removed. FIG. 10B is a sectional view schematically illustrating the bonded wafer 17 after the execution of the cutting surface treatment step (S13). By this cutting surface treatment step (S13), the whole of the damage layer 11d and the damage layer 15c is removed, for example.

Note that, in the cutting surface treatment step (S13), the damage layer 11d and the damage layer 15c do not have to be removed. That is, in the cutting surface treatment step (S13), it suffices that the damage layer 11d and the damage layer 15c can be repaired in order to suppress breakage of the wafer 11 in grinding of the wafer 11 and generation of dust in a step after this grinding.

For example, in the cutting surface treatment step (S13), the damage layer 11d and the damage layer 15c may be irradiated with the laser beam L in such a manner that the damage layer 11d and the damage layer 15c slightly melt and then immediately solidify. This can smooth the surfaces of the damage layer 11d and the damage layer 15c (cutting surface) and anchor dust (cutting dust) that adheres to the cutting surface in such a manner as to be buried in the wafer 11 and the support wafer 15.

Moreover, it is preferable to set the output power of the laser beam L in the cutting surface treatment step (S13) to 1 to 30 W, for example, to remove or repair the damage layer 11d, similarly to the cutting surface treatment step (S2).

In the method illustrated in FIG. 7, after the execution of the cutting surface treatment step (S13), the bonded wafer 17 is ground to be thinned to the finished thickness (grinding step: S14). This grinding step (S14) is executed similarly to the above-described grinding step (S4), and therefore, the above description is incorporated here.

Also, in the processing method of a wafer illustrated in FIG. 7, breakage of the wafer 11 that originates from the outer circumferential region in the grinding step (S14) and generation of dust in a step after the grinding step (S14) can be suppressed similarly to the processing method of a wafer illustrated in FIG. 2.

Further, in the processing method of a wafer according to the present invention, the bonding step does not have to be executed. That is, in the processing method of a wafer according to the present invention, all the trimming step, the cutting surface treatment step, and the grinding step may be executed for a single wafer. FIG. 11 is a flowchart schematically illustrating one example of such a processing method of a wafer.

In this method, first, a beveled outer circumferential region of the wafer 11 is annularly cut (trimming step: S21). This trimming step (S21) is executed similarly to the above-described trimming step (S1), and therefore, the above description is incorporated here.

In the method illustrated in FIG. 11, after the execution of the trimming step (S21), the cutting surface in the outer circumferential region of the wafer 11 is irradiated with a laser beam (cutting surface treatment step: S22). This cutting surface treatment step (S22) is executed similarly to the above-described cutting surface treatment step (S2), and therefore, the above description is incorporated here.

Figure 12A:
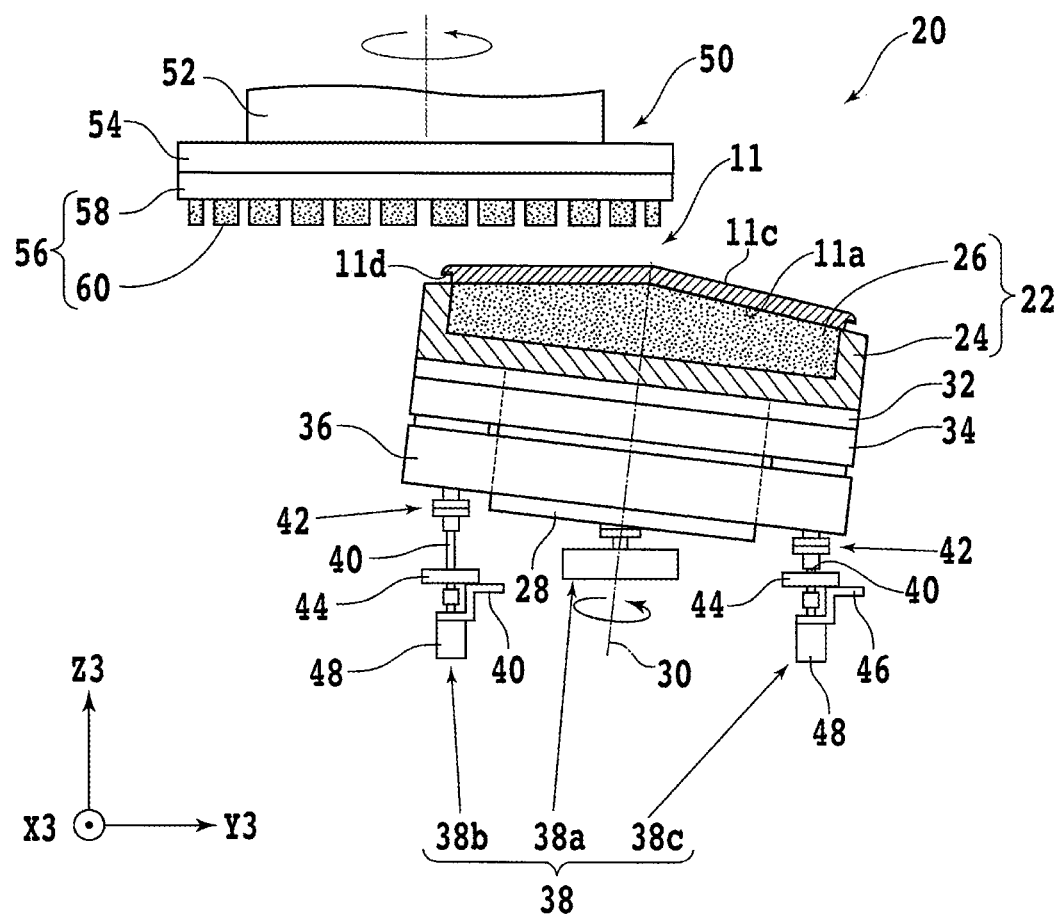
FIG. 12A is a partially sectional side view schematically illustrating the state in which a grinding step is executed for the wafer.

In the method illustrated in FIG. 11, after the execution of the cutting surface treatment step (S22), the wafer 11 is ground to be thinned to a finished thickness (grinding step: S23). FIG. 12A is a partially sectional side view schematically illustrating the state in which the grinding step (S23) is executed for the wafer 11. Note that, regarding the grinding apparatus 20 used in the grinding step (S23), the above description is incorporated.

This grinding step (S23) is executed in the following order, for example. First, the horizontal direction movement mechanism moves the chuck table 22 to position the chuck table 22 to a position that is separate from the grinding wheel 56 and at which the wafer 11 can be carried in to the holding surface of the chuck table 22.

Next, a film-shaped protective member (not illustrated) with a diameter substantially equal to that of the wafer 11 is stuck to the front surface 11a of the wafer 11. This protective member is composed of resin, for example, and alleviates shock applied to the front surface 11a and protects the devices 13 when the back surface 11c of the wafer 11 is ground.

Subsequently, the wafer 11 is carried in to the holding surface of the chuck table 22 with the back surface 11c oriented upward, and thereafter, the suction source is operated to cause the front surface 11a of the wafer 11 to be held under suction by the chuck table 22.

Next, the tilt of the chuck table 22 is adjusted. Specifically, the tilt adjustment unit 38 adjusts the tilt of the chuck table 22 in such a manner that the line segment that links the highest point in the points on the outer circumference of the holding surface of the chuck table 22 and the center of the holding surface becomes perpendicular to the Z3-axis direction. That is, the tilt adjustment unit 38 adjusts the tilt of the chuck table 22 to cause this line segment to become parallel to the lower surfaces of the plural grinding abrasive stones 60. Note that, when this line segment has become perpendicular to the Z3-axis direction in advance, the adjustment of the tilt of the chuck table 22 is omitted.

Subsequently, the horizontal direction movement mechanism moves the chuck table 22 such that the locus of the plural grinding abrasive stones 60 of the grinding wheel 56 being rotated overlaps with one end and the other end of the above-described line segment in plan view. Next, the rotational drive source coupled to the upper end part of the spindle 52 rotates the grinding wheel 56 together with the spindle 52, and the rotational drive source coupled to the lower part of the spindle 28 rotates the chuck table 22 together with the spindle 28.

Next, the Z3-axis direction movement mechanism lowers the grinding unit 50 to bring the lower surfaces of the plural grinding abrasive stones 60 into contact with the back surface 11c of the wafer 11 while the liquid (grinding water) is supplied from the nozzle disposed near the grinding wheel 56 to the back surface 11c of the wafer 11. Thus, part of the back surface 11c of the wafer 11 is ground to be removed. Moreover, with the grinding wheel 56 and the chuck table 22 being rotated, the Z3-axis direction movement mechanism lowers the grinding unit 50 until the wafer 11 is thinned to the finished thickness.

Figure 12B:
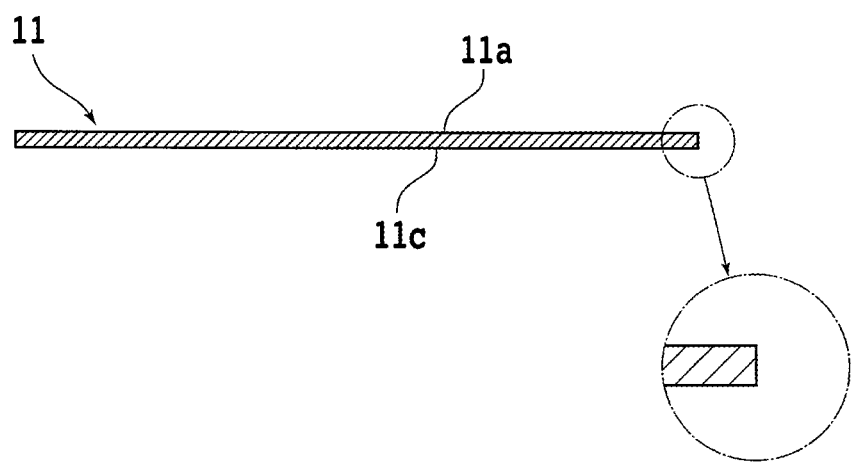
FIG. 12B is a sectional view schematically illustrating one example of the wafer that has been undergone the grinding step.

As a result, the damage layer 11d remaining as well as the beveled part of the outer circumferential region of the wafer 11 that remains on the back surface 11c side is removed. FIG. 12B is a sectional view schematically illustrating the wafer 11 after the execution of the grinding step (S23). By this grinding step (S23), for example, a part of the damage layer 11d that extends along the planar direction of the wafer 11 is removed.

Also, in the processing method of a wafer illustrated in FIG. 11, breakage of the wafer 11 that originates from the outer circumferential region in the grinding step (S23) and generation of dust in a step after the grinding step (S23) can be suppressed similarly to the processing method of a wafer illustrated in FIG. 2 or FIG. 7.

Further, in the trimming steps (S1) and (S21) of the above-described methods, the edge trimming is executed in such a manner that part of the beveled outer circumferential region of the wafer 11 on the back surface 11c side is left. However, in the trimming step of the method according to the present invention, the edge trimming may be executed to remove the whole of the beveled outer circumferential part of the wafer 11.

That is, in the trimming step of the method according to the present invention, the edge trimming may be executed to cause the damage layer 11d to be formed only along the thickness direction of the wafer 11. Such edge trimming is executed by making the cutting blade 12 cut into the wafer 11 in the state in which the lowermost end of the cutting blade 12 is positioned to a height lower than the back surface 11c of the wafer 11, for example.

In this case, it is preferable that a dicing tape is stuck to the back surface 11c of the wafer 11. That is, it is preferable that the edge trimming of the wafer 11 is executed in the state in which the wafer 11 is held under suction by the chuck table 6 with the interposition of this dicing tape. This can prevent damage to the chuck table 6 due to the contact of the cutting blade 12 with the chuck table 6.

Moreover, in the cutting surface treatment steps (S2), (S13), and (S22) of the above-described methods, the surface of the damage layer 11d (and damage layer 15c) of the wafer 11 is irradiated with the laser beam. However, in the cutting surface treatment step of the method according to the present invention, energy may be supplied to the damage layer 11*d* (and damage layer 15*c*) by a method other than the irradiation with the laser beam.

That is, in the cutting surface treatment step of the method according to the present invention, any means may be used as long as it is possible to locally supply energy to the damage layer 11*d* and remove or repair the damage layer 11*d* without causing an adverse effect on the devices 13. For example, in the cutting surface treatment step of the method according to the present invention, the laser beam may be replaced by local atmospheric-pressure plasma, an ion beam, or the like.

Besides, structures, methods, and so forth according to the above-described embodiments can be carried out with appropriate changes without departing from the range of the object of the present invention.

The present invention is not limited to the details of the above described preferred embodiments. The scope of the invention is defined by the appended claim and all changes and modifications as fall within the equivalence of the scope of the claim are therefore to be embraced by the invention.

What is claimed is:

1. A processing method of a wafer in which the wafer having an outer circumferential region that is beveled is ground to be thinned, the processing method comprising:
    a trimming step of making a cutting blade cut into the outer circumferential region that is beveled from one surface side of the wafer and annularly cutting the outer circumferential region that is beveled to remove at least part of the outer circumferential region that is beveled; and
    a cutting surface treatment step of, after execution of the trimming step, locally supplying energy to a cutting surface that is formed in the outer circumferential region in the trimming step;
    wherein the trimming step results in a damage layer being formed in the vicinity of the cutting surface and wherein a portion of the damage layer is removed during the treatment step,
    wherein the wafer has a thickness direction and a perpendicular longitudinal direction, wherein the outer circumferential region is spaced from a central region of the wafer in the longitudinal direction,
    wherein during the trimming step, a beveled portion of the outer circumferential region of the wafer remains after the trimming step whereby the cutting surface exposed has a first surface extending in the longitudinal direction and a second surface extending in the thickness direction, wherein the damage layer comprises a first portion extending in the longitudinal direction and a second portion extending in the thickness direction,
    wherein the treatment step comprises removing the second portion of the damage layer extending in the thickness direction.

2. The processing method of claim 1 further comprising after the treatment step grinding the wafer to thereby thin the wafer.

3. The processing method of claim 2 wherein prior to the trimming step, bonding the wafer to a support wafer.

4. The processing method of claim 2 wherein a beveled portion of the outer circumferential region of the wafer remains after the trimming step, and wherein grinding the wafer comprises grinding the wafer so as to remove the beveled portion of the outer circumferential region of the wafer that remained after the trimming step.

5. The processing method of claim 4 wherein prior to grinding the wafer, bonding the wafer to a support wafer.

6. The processing method of claim 2 wherein prior to grinding the wafer, bonding the wafer to a support wafer.

7. A processing method of a wafer in which the wafer having an outer circumferential region that is beveled is to be ground to be thinned, the processing method comprising:
    a trimming step of making a cutting blade cut into the outer circumferential region that is beveled from one surface side of the wafer and annularly cutting the outer circumferential region that is beveled to remove at least part of the outer circumferential region that is beveled and thereby exposing a cutting surface formed in the outer circumferential region in the trimming step, whereby a damage layer is formed in the vicinity of the cutting surface; and
    a treatment step of, after execution of the trimming step, locally supplying energy to the damage layer,
    wherein the wafer has a thickness direction and a perpendicular longitudinal direction, wherein the outer circumferential region is spaced from a central region of the wafer in the longitudinal direction,
    wherein during the trimming step, a beveled portion of the outer circumferential region of the wafer remains after the trimming step whereby the cutting surface exposed has a first surface extending in the longitudinal direction and a second surface extending in the thickness direction, wherein the damage layer comprises a first portion extending in the longitudinal direction and a second portion extending in the thickness direction,
    wherein the treatment step comprises removing the second portion of the damage layer extending in the thickness direction.

8. The processing method of claim 7 wherein a portion of the damage layer is removed during the treatment step.

9. The processing method of claim 7 wherein a portion of the damage layer is melted during the treatment step.

10. The processing method of claim 7 further comprising after the treatment step grinding the wafer to thereby thin the wafer.

11. The processing method of claim 10 wherein a beveled portion of the outer circumferential region of the wafer remains after the trimming step, and
    wherein grinding the wafer comprises grinding the wafer so as to remove the beveled portion of the outer circumferential region of the wafer that remained after the trimming step.

12. The processing method of claim 11 wherein prior to grinding the wafer, bonding the wafer to a support wafer.

13. The processing method of claim 11 wherein the wafer is bonded to a support wafer in a manner that a side of the wafer from which at least part of the outer circumferential region that has been removed during the trimming step is adjacent to the support wafer and wherein an opposing side of the wafer comprising a beveled portion of the outer circumferential region of the wafer that remains after the trimming step is distal to the support wafer.

14. The processing method of claim 10 wherein prior to grinding the wafer, bonding the wafer to a support wafer.

15. The processing method of claim 10 wherein prior to the trimming step, bonding the wafer to a support wafer.

* * * * *